(12) United States Patent
Kim et al.

(10) Patent No.: US 11,618,834 B2
(45) Date of Patent: Apr. 4, 2023

(54) INK BLOCKING LAYER FOR DISPLAY DEVICE AND MANUFACTURING METHOD THEREOF

(71) Applicants: DONG YANG INK CO., LTD, Pyeongtaek-si (KR); Samsung Display Co., Ltd., Yongin-si (KR)

(72) Inventors: Dong Ho Kim, Hwaseong-si (KR); Ji Won Choi, Pyeongtaek-si (KR)

(73) Assignees: Samsung Display Co., Ltd., Yongin-si (KR); Dong Yang Ink Co., Ltd., Pyeongtaek-si (KR)

( * ) Notice: Subject to any disclaimer, the term of this patent is extended or adjusted under 35 U.S.C. 154(b) by 9 days.

(21) Appl. No.: 17/331,572

(22) Filed: May 26, 2021

(65) Prior Publication Data

US 2021/0284865 A1  Sep. 16, 2021

Related U.S. Application Data

(62) Division of application No. 16/116,755, filed on Aug. 29, 2018, now Pat. No. 11,041,088.

(30) Foreign Application Priority Data

Sep. 4, 2017  (KR) .................. 10-2017-0112373

(51) Int. Cl.
| | | |
|---|---|---|
| *C09D 163/00* | (2006.01) | |
| *H05K 5/00* | (2006.01) | |
| *B32B 7/12* | (2006.01) | |
| *C09J 5/00* | (2006.01) | |
| *C08G 59/42* | (2006.01) | |
| *C08G 59/32* | (2006.01) | |

(Continued)

(52) U.S. Cl.
CPC ............. *C09D 163/00* (2013.01); *B32B 7/12* (2013.01); *C08G 59/32* (2013.01); *C08G 59/42* (2013.01); *C08G 59/5006* (2013.01); *C09J 5/00* (2013.01); *H05K 5/0017* (2013.01); *B32B 2255/26* (2013.01); *B32B 2457/20* (2013.01); *C08K 3/04* (2013.01); *C08K 2003/3045* (2013.01);

(Continued)

(58) Field of Classification Search
CPC ................................................ G02F 2001/501
See application file for complete search history.

(56) References Cited

U.S. PATENT DOCUMENTS

| | | |
|---|---|---|
| 7,566,377 B2 | 7/2009 | Miyawaki et al. |
| 2006/0009579 A1 | 1/2006 | Miyawaki et al. |

(Continued)

FOREIGN PATENT DOCUMENTS

| | | |
|---|---|---|
| JP | 6146020 B2 | 10/1986 |
| JP | 7137265 A | 5/1995 |

(Continued)

OTHER PUBLICATIONS

Korean Notice of Allowance for Patent Application No. 10-2017-0112373, dated Sep. 27, 2021, 2 pages.

*Primary Examiner* — Ian A Rummel
(74) *Attorney, Agent, or Firm* — Lewis Roca Rothgerber Christie LLP (57) ABSTRACT

A method of manufacturing an ink blocking layer for a display device, an ink blocking layer for a display device, and a display device are provided. The method of manufacturing an ink blocking layer for a display device includes: preparing a main material including an epoxy monomer having three or more epoxy groups and a curing agent including an acid and an amine; and mixing the main material with the curing agent to prepare an epoxy resin.

10 Claims, 3 Drawing Sheets

(51) Int. Cl.
  *C08G 59/20* (2006.01)
  *C08G 59/50* (2006.01)
  *H05K 1/14* (2006.01)
  *C08K 3/04* (2006.01)
  *G02F 1/1335* (2006.01)
  *C08K 3/30* (2006.01)
  *G02F 1/1333* (2006.01)

(52) U.S. Cl.
  CPC ..... *C09J 2433/00* (2013.01); *G02F 1/133331* (2021.01); *G02F 1/133388* (2021.01); *G02F 1/133512* (2013.01); *G02F 2201/501* (2013.01); *G02F 2202/023* (2013.01); *H05K 1/147* (2013.01); *H05K 2201/056* (2013.01); *H05K 2201/10128* (2013.01)

(56) References Cited

U.S. PATENT DOCUMENTS

| | | |
|---|---|---|
| 2009/0069513 A1 | 3/2009 | Nakanishi et al. |
| 2015/0062841 A1 | 3/2015 | Jin et al. |

FOREIGN PATENT DOCUMENTS

| | | |
|---|---|---|
| JP | 3909072 B2 | 4/2007 |
| JP | 4394281 B2 | 1/2010 |
| JP | 5258155 B2 | 8/2013 |
| JP | 2014188863 A | 10/2014 |
| JP | 2015-212399 A | 11/2015 |
| JP | 2017141449 A | 8/2017 |
| KR | 10-2008-0013902 A | 2/2008 |
| KR | 10-2015-0105248 A | 9/2015 |

INK BLOCKING LAYER FOR DISPLAY DEVICE AND MANUFACTURING METHOD THEREOF

CROSS-REFERENCE TO RELATED APPLICATION

This application is a divisional application of U.S. patent application Ser. No. 16/116,755, filed on Aug. 29, 2018, which claims priority to and the benefit of Korean Patent Application No. 10-2017-0112373, filed on Sep. 4, 2017, in the Korean Intellectual Property Office, the entire contents of all of which are incorporated herein by reference.

BACKGROUND

1. Field

The following description relates to an ink blocking layer for a display device, and a method of manufacturing the same.

2. Description of the Related Art

A display device is a device that displays an image utilizing an organic light-emitting element, liquid crystal element, or the like. The display device is applied to a TV, a monitor, a notebook, a tablet PC, a mobile phone, and/or the like.

The display device may include a window. A mobile phone, a tablet PC, and the like are easily exposed to external environment because they can be utilized on the move without being fixed (e.g., fixed at a set location). Here, when the touch function is added, the function of the window is more important because external force is continuously (e.g., frequently) applied thereto. In such a window, its edge is printed with ink to form an ink layer, and this ink layer may define a non-display area of the display device.

Generally, the window may be attached to a display panel by an adhesive material such as a curable resin. In comparable art, a Y-Map method has been utilized in which a curable resin is applied onto the back side of the window in a Y-shape, the window is attached to a display panel, an electric field is applied to uniformly spread the curable resin, and then ultraviolet light is applied to cure the curable resin.

However, in such a Y-Map method, the curable resin may overflow to the region of the ink layer because it is not easy to appropriately adjust (e.g., control) the amount of the curable resin. Further, in the Y-Map method, since ultraviolet light hardly reaches a portion provided with the ink layer due to the blocking of the light by a driving element (such as a flexible circuit board), the curable resin in the portion in contact with the ink layer is partially uncured, and therefore exhibits high fluidity and permeability.

The ink layer may contain a resin obtained by the polymerization of an epoxy compound such as bisphenol A epoxy. Here, because the bisphenol A epoxy has a high epoxy equivalent of 180 to 200, the epoxy resin polymerized therefrom may also have a structure into which uncured resin easily penetrates. When the uncured resin penetrates into the ink layer, the ink layer may become visibly defective due to ink stain or the like.

SUMMARY

Accordingly, in order to solve the above described problem, aspects of the present disclosure are directed toward an ink blocking layer for a display device, which can prevent or reduce the penetration of uncured adhesive resin in order to prevent or substantially prevent visibility failure, and a method of manufacturing the same.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to an embodiment of the present disclosure, a method of manufacturing an ink blocking layer for a display device includes: preparing a main material including an epoxy monomer having three or more epoxy groups and a curing agent including an acid and an amine; and mixing the main material with the curing agent to prepare an epoxy resin.

The epoxy monomer may have an epoxy equivalent of 95 to 110 g/eq.

The epoxy monomer may be produced by a reaction of a polyhydric alcohol and epichlorohydrin.

The polyhydric alcohol may be a trihydric or higher alcohol.

The polyhydric alcohol may be a heptahydric or higher alcohol produced by a reaction of a hexahydric or lower alcohol and isocyanate.

The acid may include a carboxyl group (—COOH).

The acid may be an acrylic acid resin.

The acid may have an acid value of 5 to 15.

The amine may be included in the curing agent in an amount of more than 0 wt % and less than 20 wt % with respect to a total amount of the acid.

The mixing of the main material with the curing agent may be performed at 100° C. to 160° C.

The mixing of the main material with the curing agent may be performed for 5 to 30 minutes.

The amine may include at least one of triethylenetetramine (TETA), diethylenetriamine (DETA), and ethylenediamine (EDA).

According to an embodiment of the present disclosure, an ink blocking layer for a display device includes an epoxy resin obtained by polymerization of an epoxy monomer having an epoxy equivalent of 95 to 110 g/eq; and at least one of an unreacted acrylic acid resin and an unreacted amine.

The acrylic acid resin may have an acid value of 5 to 15.

The ink blocking layer may further include carbon black.

According to an embodiment of the present disclosure, a display device includes a window; an ink blocking layer on a portion of the window; an adhesive layer on the window, at least a portion of the adhesive layer being directly on the ink blocking layer; and a display panel on the adhesive layer. The ink blocking layer includes an epoxy resin obtained by polymerization of an epoxy monomer having an epoxy equivalent of 95 to 110 g/eq.

The ink blocking layer may include at least one of an unreacted acrylic acid resin or an unreacted amine The ink blocking layer may further include carbon black.

The adhesive layer may include a resin cured by light irradiation.

The display device may further include a ground color ink layer between the window and the ink blocking layer. The ink blocking layer covers at least one surface of the ground color ink layer.

BRIEF DESCRIPTION OF THE DRAWINGS

The above and other aspects and features of the present disclosure will become more apparent by describing in more detail exemplary embodiments thereof with reference to the accompanying drawings, in which.

DETAILED DESCRIPTION

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the scope of the present disclosure will be defined by the appended claims, and equivalents thereof.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. The term "at least one" is not to be construed as limiting "a" or "an." "Or" means "and/or." As used herein, the term "and/or" includes any and all combinations of one or more of the associated listed items.

It will be understood that when an element or layer is referred to as being "on," "connected to" or "coupled to" another element or layer, the element or layer can be directly on, connected or coupled to another element or layer, or intervening elements or layers may be present. In contrast, when an element is referred to as being "directly on," "directly connected to" or "directly coupled to" another element or layer, there are no intervening elements or layers present. As used herein, the term "connected" may refer to elements being physically, electrically and/or fluidly connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Hereinafter, embodiments of the present disclosure will be described with reference to the accompanying drawings.

The method of manufacturing an ink blocking layer for a display device according to an embodiment of the present disclosure is a method of manufacturing an ink blocking layer containing an epoxy resin having high crosslinking density or a highly crosslinked epoxy resin as a main component. For example, this method includes an act of preparing an epoxy resin by mixing a main material including an epoxy monomer with a curing agent.

The main material is a composition as a base material for preparing an epoxy resin, and includes an epoxy monomer. The main material may further include at least one selected from carbon black, a carbon dispersant, a defoamer, a solvent, and a filler, in addition to the epoxy monomer.

The epoxy monomer may be an epoxy-based compound having three or more epoxy groups as functional groups in one molecule, and for example, may be an epoxy-based compound having six or more epoxy groups. The epoxy monomer may have an epoxy equivalent of 95 to 110 g/eq, and for example, 98 to 102 g/eq.

When the epoxy monomer has three or more epoxy groups or has an epoxy equivalent of 95 to 110 g/eq, the epoxy resin obtained by the crosslinking and polymerization of the epoxy monomers may have high crosslinking density, so as to obtain a denser molecular structure. Thus, the penetration of foreign matters, for example, uncured adhesive resin, into the ink blocking layer can be reduced or prevented.

The epoxy equivalent may be defined as a value obtained by dividing the molecular weight of a compound containing an epoxy group by the number of epoxy groups, and may be analyzed and calculated utilizing a chemical titration method. In general, the epoxy group may have a lower epoxy equivalent as the number of epoxy groups increases, and accordingly, the compound may contain a larger amount of epoxy groups per unit weight.

In an exemplary embodiment, the epoxy monomer may be a trifunctional epoxy monomer, that is, an epoxy monomer having three epoxy groups. In this case, the epoxy equivalent may be 100 to 102 g/eq. The epoxy monomer may be a hexafunctional epoxy monomer, that is, an epoxy monomer having six epoxy groups. In this case, the epoxy equivalent may be lowered to a level of 98 to 99 g/eq.

The epoxy monomer may be produced by the reaction of a polyhydric alcohol with epichlorohydrin. For example, the polyhydric alcohol may be glycidylated by reacting with epichlorohydrin under (e.g., at the presence of) a catalyst, such as an alkali metal hydroxide, for example, sodium hydroxide (NaOH), so as to obtain the epoxy monomer.

The polyhydric alcohol may be a tri- or more functional alcohol having three or more functional groups, that is, three or more hydroxyl groups (—OH). For example, the polyhydric alcohol may be a hexahydric or higher alcohol having six or more hydroxyl groups. The more the number of functional groups of the polyhydric alcohol, the more the number of functional groups the epoxy monomer formed from the polyhydric alcohol may have. When the polyhydric alcohol is a trihydric or higher alcohol, the epoxy monomer may also have three or more epoxy groups.

Trihydric or higher alcohol may be prepared by any suitable synthesis method. Heptahydric or higher alcohol may be prepared by the reaction of hexahydric or lower alcohol and isocyanate. For example, a decahydric alcohol may be prepared by the reaction of dipentaerithritol as a hexahydric alcohol with isocyanate according to Reaction Formula 1 below, but the present disclosure is not limited thereto.

Reaction Formula 1

When a decahydric alcohol is prepared according to Reaction Formula 1 above, the amount of isocyanate may be selected such that the number of functional groups of isocyanate relative to the number of functional groups of dipentaerythritol is 10% or less. When the amount of isocyanate utilized is within the above range, it is possible to prevent (or substantially prevent) a mixture from being hardened by a crosslinking reaction between dipentaerythritol and isocyanate.

In an exemplary example, the epoxy monomer may be a trifunctional epoxy-based compound prepared by the reaction of trimethylolpropane as a trihydric alcohol with epichlorohydrin according to Reaction Formula 2 below.

Reaction Formula 2

In another exemplary example, the epoxy monomer may be a hexafunctional epoxy-based compound prepared by the reaction of dipentaerythritol as a hexahydric alcohol with epichlorohydrin according to Reaction Formula 3 below.

Reaction Formula 3

However, the reaction or method for preparing the epoxy monomer of the present disclosure is not limited thereto, and it is also within the scope of the present disclosure to prepare an epoxy monomer having three or more functional groups by various suitable reactions or methods.

The carbon black may be included to impart a light-blocking function to the ink blocking layer, and the carbon dispersant may be included to uniformly disperse the carbon black in the ink blocking layer. The solvent and the filler may be included to adjust the concentration or viscosity of the main material to a predetermined or set level.

The curing agent is utilized for producing an epoxy resin by crosslinking the epoxy monomer contained in the main material, and includes an acid and an amine. The curing agent may further include a solvent for adjusting the concentration or viscosity.

The acid and the amine may be crosslinked with adjacent epoxy monomers, respectively, and crosslinking may also occur between the acid and the amine. Thus, the epoxy resin polymerized by an acid and an amine may form a very complicated and dense network structure.

In order for the acid to react with the epoxy monomer, reaction temperature should be high and reaction time should be long. However, when the acid is present together with the amine, the crosslinking reaction may be completed within 160 minutes at 30° C. or lower. The amine may also react with the epoxy monomer independently, but when the amine is present together with the acid, an epoxy resin having a denser structure can be formed.

The acid may be a compound containing a carboxyl group (—COOH), and for example, may be an acrylic acid resin. The acrylic acid resin may be prepared by the radical copolymerization of acrylic acid according to Reaction Formula 4 below. However, the method of synthesizing the acrylic acid resin of the present disclosure is not limited thereto.

Reaction Formula 4

The compound containing a carboxyl group is not limited to an acrylic acid resin, and the acid may be a carboxylic acid produced by the reaction of an alcohol with an acid anhydride. The acid may include at least one of an acrylic acid resin and a carboxylic acid. The above-mentioned carboxylic acid may be, for example, a carboxylic acid prepared by the reaction of glycerin with tetrahydrophthalic anhydride (THPA) according to Reaction Formula 5 below, but embodiments of the present disclosure are not limited thereto.

Reaction Formula 5

The acid may have an acid value of 5 to 15. When the acid value of the acid is 5 or more, the crosslinking reaction with the epoxy monomer can be sufficiently performed. Further, when the acid value thereof is 15 or less, a coagulation phenomenon of the acid and amine may be avoided, and thus it is possible to prevent (or substantially prevent) the viscosity of the curing agent from becoming excessively high.

The amine may be a polyfunctional compound having two or more amino groups (—$NH_2$, —NRH, —$NR_2$), and for example, may be at least one selected from triethylenetetramine (TETA), diethylenetriamine (DETA) and ethylenediamine (EDA), but the present disclosure is not limited thereto.

The amine may be included in the curing agent in an amount of more than 0 wt % and less than 20 wt % with respect to the acid (e.g., based on the total weight of the acid). When the amount of the amine is less than 20 wt % with respect to the acid, it is possible to prevent (e.g., substantially prevent) the viscosity of the curing agent from increasing excessively due to the coagulation phenomenon of the amine and the acid.

The main material and the curing agent may be mixed at a weight ratio of 100:5 to 100:15. As described above, the crosslinking reaction may be completed within 30 minutes at 160° C. or lower. However, in order to satisfy the minimum requirements for the crosslinking reaction, the reaction temperature may be 100° C. or higher, and the reaction time may be 5 minutes or more.

The ink blocking layer may be formed such that it is cured and attached to the window by applying a mixture of the main material and the curing agent onto the window and then performing a crosslinking reaction. However, the present disclosure is not limited thereto.

As the crosslinking reaction of the main material and the curing agent is completed, most of the acid and amine contained in the curing agent are bonded to the epoxy monomer, but a trace amount of the acid and/or amine may remain in the ink blocking layer in an unreacted state. That is, the ink blocking layer may contain at least one of a trace amount of unreacted acid, for example, acrylic acid resin, and unreacted amine.

Since the epoxy resin prepared as described above has a very complicated and dense polymerization structure and high crosslinking density, the ink blocking layer for a display device containing the epoxy resin has a desired feature that an uncured adhesive resin or the like can hardly infiltrate into the ink blocking layer.

Hereinafter, a structure in which the ink blocking layer is applied to a display device will be described in more detail. Hereinafter, a display device in which a frameless bezel not provided with a top cover covering a part of the upper portion of the display device or a thin narrow bezel applied to the display device will be exemplified, but the present disclosure is not limited thereto.

Figure 1:
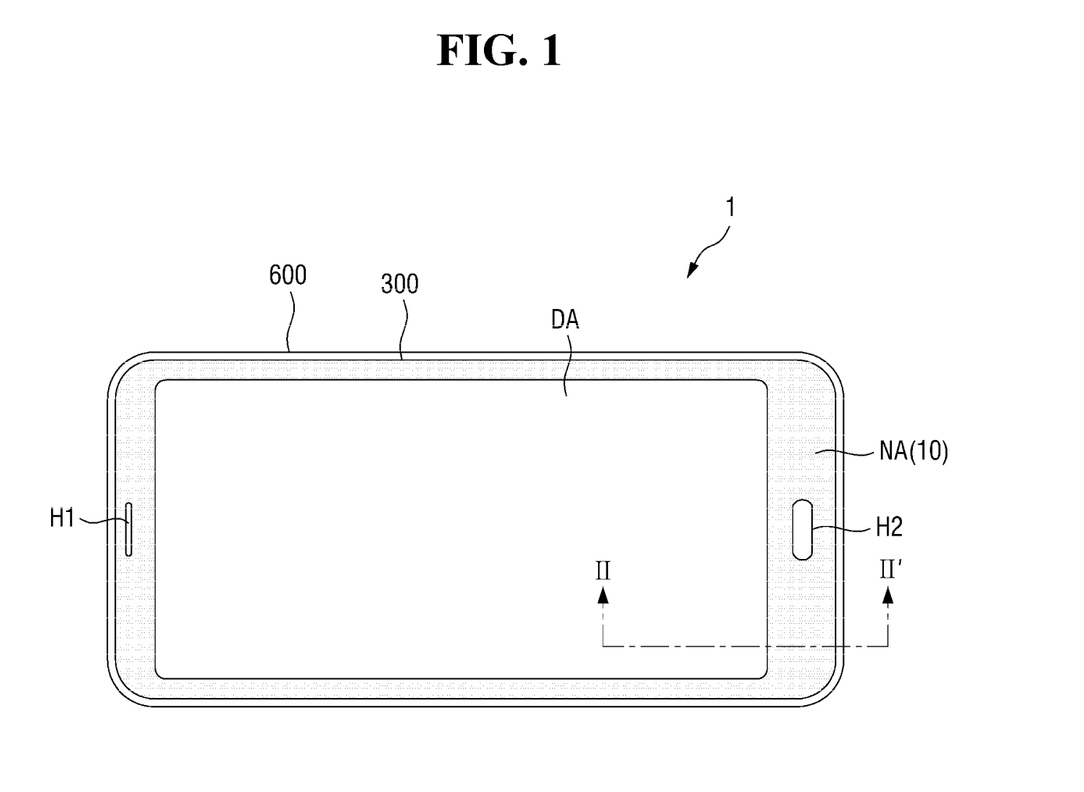
FIG. 1 is a plan view of a display device according to an embodiment of the present disclosure.
Figure 2:
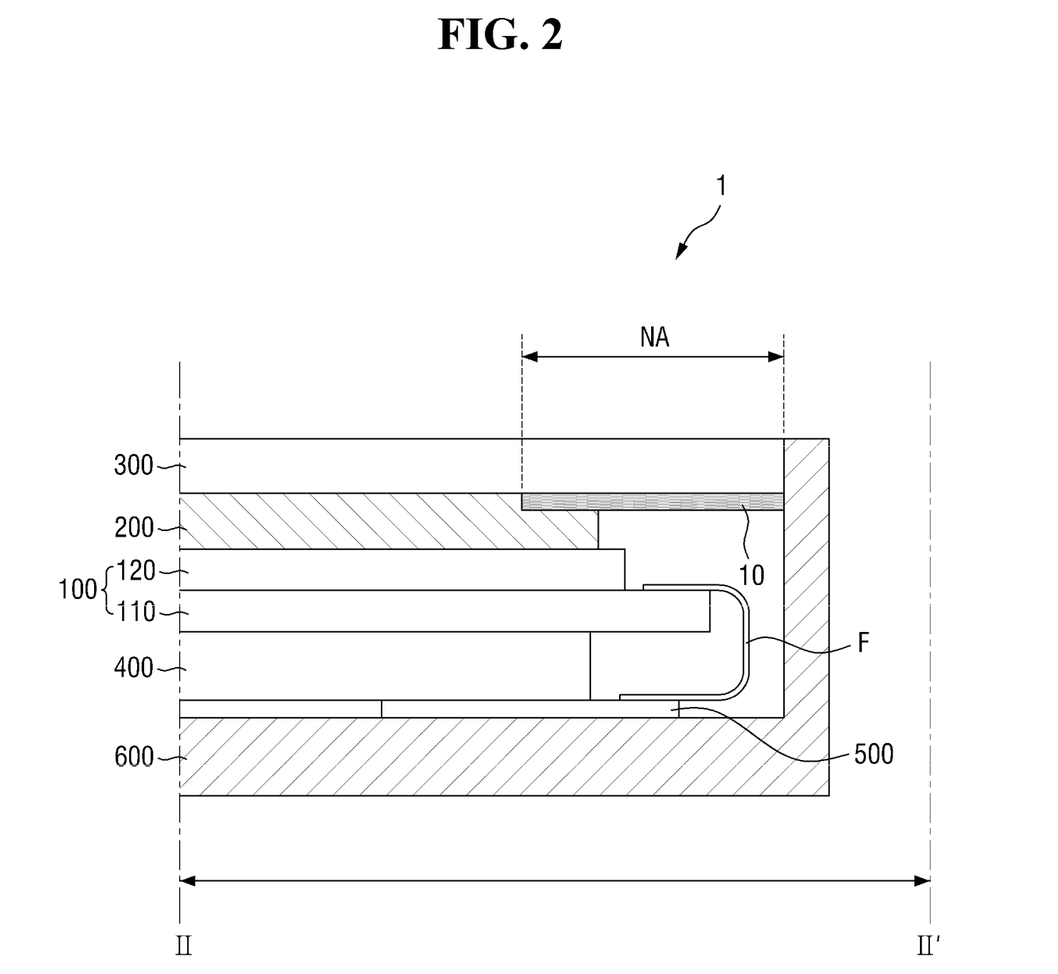
FIG. 2 is a sectional view taken along the line II-II' of FIG. 1.

FIG. 1 is a plan view of a display device according to an embodiment of the present disclosure, and FIG. 2 is a sectional view taken along the line II-II' of FIG. 1.

Referring to FIG. 1, a display device 1 may include a window 300 and a chassis 600.

The window 300 can protect a display panel 100 from external impacts while allowing an image displayed by the display panel to be visually viewed. In the drawing, a case where the window 300 has a rectangular shape in which each corner has a curved line on a plane is illustrated, but the present disclosure is not limited thereto.

The window 300 includes a display area DA and a non-display area NA on a plane (e.g., on the top surface or the bottom surface of the window 300). The display area DA is an area in which an image displayed from the display panel 100 is visible, and the non-display area NA is an area in which the image is not visible. The non-display area NA is disposed around the display area DA. For example, when the display area DA is formed in a rectangular shape, the non-display area NA may be disposed along the outer circumference of the display area DA.

The non-display area NA of the window 300 may be provided with a hole H1 corresponding to a speaker or camera region and a hole H2 corresponding to a button region.

A plurality of pixels may be defined in the display area DA of the window 300. The plurality of pixels may be arranged in a matrix shape. Signal lines for driving each pixel, for example, a gate line and a data line may be disposed at the boundary of each pixel.

The non-display area NA may be provided with a portion to which an external driving element such as a driving chip and/or a printed circuit board 500 is connected.

The chassis 600 may accommodate the elements of the display device 1 including the window 300. The chassis 600 may have a plate shape having a bottom and side walls. On a plane, the side walls of the chassis 600 may be disposed in a shape surrounding the circumference of the window 300.

The display device 1 may further include an ink blocking layer 10 disposed on the lower surface of the window 300. The ink blocking layer 10 may be disposed to overlap the non-display area NA of the window 300 on a plane.

Hereinafter, a sectional structure of the display device 1 including the ink blocking layer 10 will be described in more detail with reference to the sectional view taken along the line II-II' of the display device 1 in FIG. 1.

Referring to FIG. 2, the display device 1 includes a chassis 600, a printed circuit board (PCB) 500, a flexible printed circuit board (FPCB) F, a protection layer 400, a display panel 100, an adhesive layer 200, a window 300, and an ink blocking layer 10.

The chassis 600 is disposed at the lower portion of the display device 1. As described above, the chassis 600 may have a plate shape having a bottom and side walls such that it can accommodate the other elements constituting the display device 1.

The printed circuit board 500 may be disposed on the bottom of the chassis 600. The printed circuit board 500 may transmit a driving signal or the like for realizing an image of the display panel 100 to the display panel 100 through the flexible printed circuit board F.

The protection layer 400 may be disposed on the printed circuit board 500. The protection layer 400 is a layer for protecting the elements in the display device 1 from externally applied physical and chemical impacts, and may include a cushion layer, a protection film, and/or the like.

The display panel 100 may be disposed on the protection layer 400. The display panel 100 is an element for realizing an image, and may include a first substrate 110 and a second substrate 120 disposed on the first substrate 110.

The first substrate 110 may be a substrate in which a thin film transistor (TFT) as a switching element is formed in a matrix shape. A data line and a gate line may be respectively connected to a source terminal and a gate terminal of the thin film transistor, and a pixel electrode made of a conductive material may be connected to a drain terminal of the thin film transistor.

A gate pad and a data pad connected to the ends of the extended gate and data lines may be disposed in a region corresponding to the non-display area NA of the first substrate 110 on a plane. The gate pad and the data pad may be electrically connected to the printed circuit board 500 through the flexible circuit board F to receive a driving signal or the like.

The second substrate 120 may be disposed to face the first substrate 110. A common electrode made of a conductive material may be formed on the second substrate 120 so as to face the pixel electrode formed on the first substrate 110. In an exemplary embodiment, RGB pixels for realizing colors may be formed on the second substrate 120 in the shape of a thin film, but the present disclosure is not limited thereto.

Although not shown in the drawings, the display panel 100 may further include a display element interposed between the first substrate 110 and the second substrate 120. The display element may be a liquid crystal display element including a liquid crystal layer or an organic light emitting display element including an organic light emitting layer, but the present disclosure is not limited thereto.

In some embodiments, the display panel 100 may further include a touch sensing unit and/or a polarizing element attached thereto or embedded therein.

The adhesive layer 200 may be disposed on the display panel 100. The adhesive layer 200 is a layer for attaching and fixing the display panel 100 to the window 300, and may contain an adhesive resin.

The adhesive resin may include a photocured resin. The photocured resin may be a material which is cured and polymerized into a polymer to exhibit an adhesive force by irradiating a photocurable composition including a monomer, an oligomer and/or the like with light of a specific wavelength.

In an exemplary embodiment, the photocurable composition may be a material cured by ultraviolet (UV) irradiation, but the present disclosure is not limited thereto.

In an exemplary embodiment, the photocurable composition may be an acrylic compound or a methacrylic compound, but the present disclosure is not limited thereto.

In an exemplary embodiment, the photocurable composition may further include a photoinitiator that generates free radicals or ions by optical exposure (e.g., stimulation), such as ultraviolet light irradiation. Examples of the photoinitiator may include, but are not limited to, alpha-hydroxy ketone, mono- or bis acylphosphine oxide, benzophenone, thioxanthone, ketosulfone, benzyl ketal, phenylglyoxylate, borate, titanocene, and oxime ester.

The adhesive resin may further include a resin cured by temperature, humidity, physical impacts, chemical stimulation, and/or the like, in addition to the photocured resin. The kind of the stimulation accelerating the curing is not limited as long as the resin is a material cured to have an adhesive force after the exposure to the stimulation.

The window 300 may be disposed on the adhesive layer 200. The window 300 may be disposed to have an area capable of covering the elements accommodated by the chassis 600 in the display device 1. As described above, the window 300 can protect a display panel 100 from external impacts while allowing an image displayed by the display panel to be visually viewed.

The ink blocking layer 10 may be disposed on the lower surface of the window 300. The ink blocking layer 10 may be disposed to overlap the non-display area NA of the window 300 on a plane. In some embodiments, the ink blocking layer 10 may be disposed in the same area as the non-display area NA to completely overlap the non-display area NA.

As described above, the ink blocking layer 10 may be a layer in which the penetration of foreign matter, for example, an uncured adhesive resin, is blocked. When the ink blocking layer 10 contains carbon black, the ink blocking layer may function as a light-blocking layer.

As described above, the ink blocking layer may contain at least one of a trace amount of unreacted acid, for example, acrylic resin, and unreacted amine.

Since at least a part of the adhesive layer 200 is disposed on the ink blocking layer 10, a portion of the adhesive layer 200 and a portion of the ink blocking layer 10 may be brought into contact (e.g., direct contact) with each other.

The adhesive layer 200 may be formed by irradiating a photocurable composition with light. Here, light hardly reaches a portion of the adhesive layer 200 that is brought into contact with the ink blocking layer 10 due to blocking of light by elements such as the printed circuit board 500 and the flexible printed circuit board F, so that the photocurable composition may be partially uncured. Since this uncured composition has a smaller molecular weight than the cured resin, it has higher fluidity and permeability. However, since the ink blocking layer 10 contains an epoxy resin having high crosslinking density, it is possible to prevent (or substantially prevent) the uncured composition from penetrating into the ink blocking layer 10.

Figure 3:
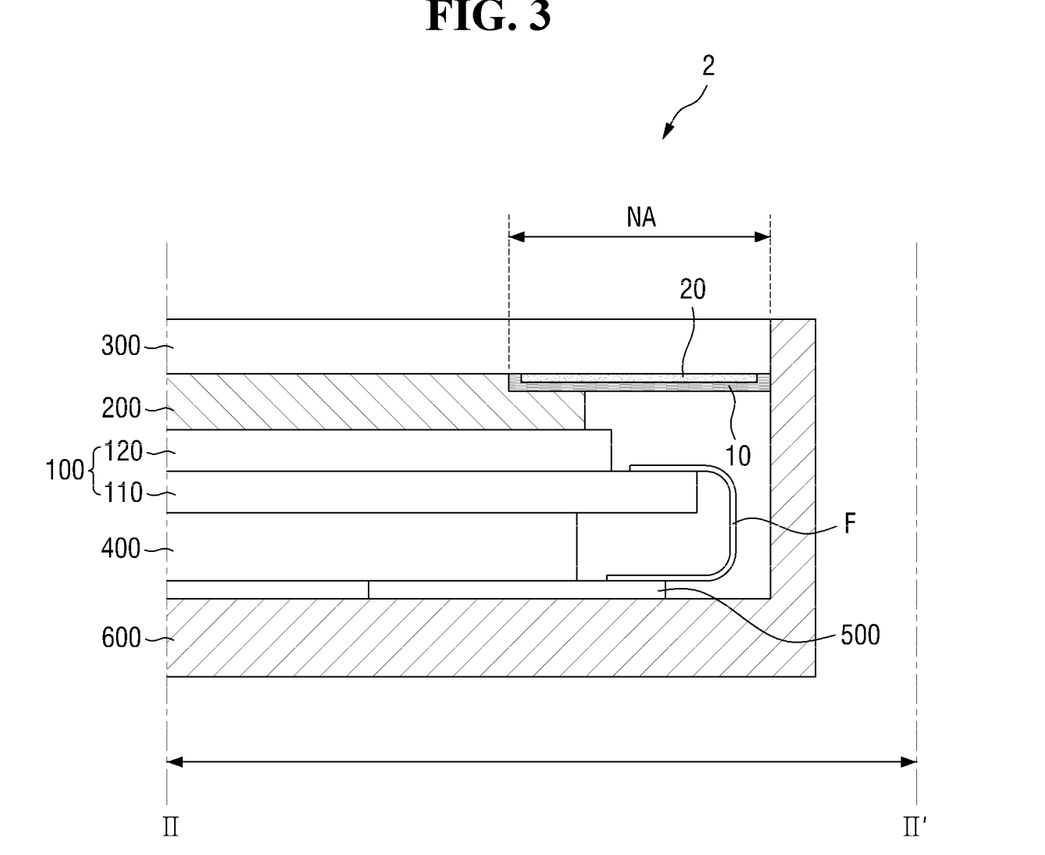
FIG. 3 is a sectional view of a display device according to another embodiment of the present disclosure.

FIG. 3 is a sectional view of a display device according to another embodiment of the present disclosure.

The display device 2 of FIG. 3 is substantially the same as the above-mentioned display device 1 of FIG. 2, except that it further includes a ground color ink layer. Hereinafter, redundant description will be omitted.

Referring to FIG. 3, the ground color ink layer 20 may be disposed between the window 300 and the ink blocking layer 10. The ink blocking layer 10 may be disposed to cover at least one surface of the ground color ink layer 20. In FIG. 3, a structure in which the ink blocking layer 10 covers the lower surface and lateral surfaces of the ground color ink layer 20 is shown.

The ground color ink layer 20 is a layer for realizing the non-display area NA in a desired color, and the color of the non-display area NA of the display device 2 is determined according to the color of the ink contained in the ground color ink layer 20. For example, the ground color ink layer 20 may include, but is not limited to, black ink, blue ink, red ink, and/or white ink. The brighter the color of the ground color ink layer 20, that is, the higher the brightness, the thinner the thickness of the ink blocking layer 10 may be. Thus, it is possible to prevent the ink blocking layer 10 under the ground color ink layer 20 from being visible. However, the present disclosure is not limited thereto.

As described above, the uncured adhesive resin may have fluidity and permeability, and visual defects such as ink stains may occur when the uncured adhesive resin reaches the ground color ink layer 20. Therefore, it is possible to prevent the ground color ink layer 20 from being damaged by forming the ink blocking layer 10, capable of reducing or preventing the penetration of the uncured adhesive resin through high crosslinking density, on the ground color ink layer 20.

Hereinafter, Preparation Example of the ink blocking layer of the present disclosure and Experimental Examples of evaluating the penetration preventing ability of the ink blocking layer will be described in more detail. However, the scope of the present disclosure is not limited to the following preparation example and experimental examples.

PREPARATION EXAMPLE 300 g of ethyl acetate as a solvent was put into a 2 L reactor, and heated to 80° C. with stirring to maintain a reflux state. Thereafter, 552 g (6.0 mol) of epichlorohydrin was slowly added, and then stirring was performed for 4 hours until epichlorohydrin was completely dissolved in the solvent. Thereafter, 0.3 g (300 ppm) of sodium hydroxide (NaOH) was added and left for 30 minutes, and then 254 g (1.0 mol) of dipentaerithritol was slowly added and completely dissolved. In this state, the reaction was maintained for 6 hours or more, and the disappearance of hydroxyl groups (—OH) of dipentaerythritol was monitored through FT-IR. When it is determined through FT-IR that the hydroxyl groups have completely disappeared, the reaction product was slowly cooled (e.g., to room temperature), 500 ml of purified water was added and stirred, and then the water was removed by a separatory funnel. This washing process was repeated three to four times. After confirming that the pH of acidity reached about 7.0, the washing process was completed. Here, since a hexafunctional epoxy monomer is dissolved in ethyl acetate, the volatilization point of the solvent is too low to be utilized directly as an ink. Therefore, 500 g of diethylene glycol monoethyl ether acetate, as a high-boiling solvent, was added to complete the preparation of an epoxy monomer varnish (solid content: about 50%).

Next, the epoxy monomer varnish and the solvent (isophorone) were put into a 2,000 cc bottle, and stirred with a stirrer. A carbon dispersant and a defoamer were added with stirring, and then barium sulfate as a filler was slowly added, followed by stirring for about 30 minutes. Next, carbon black was added thereto, followed by stirring for 30 minutes. The mixture prepared in this way was dispersed three times utilizing a three-roll mill, and it was confirmed that the particle size did not exceed 3 μm, so as to complete the preparation of a main material. The contents of respective components included in the main material are given in Table 1 below.

TABLE 1

| Components | Contents (g) |
| --- | --- |
| Epoxy monomer varnish | 600 |
| Carbon black | 150 |
| Carbon dispersant | 20 |
| Defoamer | 10 |
| Solvent (isophorone) | 120 |
| Filler (barium sulfate) | 100 |
| Total | 1000 |

In order to prepare a curing agent, first, an acrylic acid resin having an acid value of 15 was mixed with a solvent (isophorone) to lower the viscosity, and then EDA (ethylenediamine) was slowly added with stirring. When the viscosity started to increase, the resulting product was left for 2 hours and waited for the viscosity to be stabilized. Thereafter, the viscosity was stabilized to obtain a yellow transparent curing agent. The contents of respective components included in the curing agent are given in Table 2 below.

TABLE 2

| Components | Contents (g) |
| --- | --- |
| Acrylic acid resin | 100 |
| EDA | 20 |
| Solvent (isophorone) | 80 |
| Total | 200 |

Next, 100 g of the main material, 10 g of the curing agent and 10 g of a diluent (diethylene glycol monoethyl ether acetate) were put into a 200 cc bottle, and then stirred for 10 minutes. Thereafter, the mixed composition was left for 10 minutes or more to allow bubbles to disappear, and then this mixed composition was screen-printed on a reinforced glass. As a screen mesh, mesh 350 was utilized. Final curing was carried out at 150° C. for 30 minutes to form an ink blocking layer. The ink blocking layer formed by the final curing had a thickness of about 5 μm.

Experimental Example 1: Evaluation of Penetration Prevention Ability

An ink blocking layer was formed on a reinforced glass in the same manner as in Preparation Example. Specifically, a first layer having a thickness of 5 μm was formed on the reinforced glass with the above-mentioned mixed composition and cured at 150° C. for 30 minutes, and then a second layer having a thickness of 5 μm was formed thereon and finally cured at 150° C. for 30 minutes to form an ink blocking layer, thereby preparing a single printing structure (i.e., a structure with only the ink blocking layer on the reinforced glass).

Further, an acrylic resin/urethane curing ink (white) is first printed on the reinforced glass, and then the same ink blocking layer as Preparation Example is formed thereon, thereby preparing a ground color ink layer mixing structure (i.e., a structure including both the ground color ink layer and the ink blocking layer on the reinforced glass).

In order to evaluate the penetration prevention ability of these structures, a UV-curable monomer was prepared. The UV-curable monomer was prepared by adding TPO and 184 as a UV-curing initiator to isobornyl acrylate (molecular weight: 208) as a monofuctional monomer in amounts of 10% and 3%, respectively, and then stirring the mixture for 3 hours.

1 g of the prepared UV-curable monomer was applied onto each of the single printing structure and the ground color ink layer mixing structure, covered with an object capable of blocking ultraviolet light such as FPCB, an opaque film or a blade, and then left for 3 hours. After 3 hours, the UV-curable monomer was irradiated with ultraviolet light of about 3,000 mJ/cm$^2$, and then put into an oven at 70° C. After 3 hours, it was observed for any ink stains on the ink blocking layer or the ground color ink layer on the reinforced glass surface.

As the result of observation, ink stains, that is, the penetration of the UV-curable monomer did not occur in both the single printing structure and the ground color ink layer mixing structure. From the experiment, it can be ascertained that the ink blocking layer of the present disclosure is excellent in penetration prevention ability against uncured resin.

Experimental Example 2: Confirmation of Effect of Increasing Penetration Ability by Acid Two kinds of curing agents were prepared in the same manner as in Preparation Example, except that whether each of the curing agents contains an acrylic acid resin was changed as given in Table 3 below.

TABLE 3

|  | Curing agent 1 | Curing agent 2 |
| --- | --- | --- |
| Component | EDA | Acrylic acid resin + EDA (weight ratio 5:1) |
| Ratio | 4 wt % to main material | 10 wt % to main material |
| Additive amount of solvent | 10 wt % | 7 wt % |

The two kinds of curing agents were mixed with the main material. The penetration prevention ability of each of the cured ink blocking layers was evaluated in the same manner as in Experimental Example 1 depending on the curing conditions given in Table 4 below, and the evaluation results thereof are given in Table 4.

TABLE 4

| Curing conditions | Ink blocking layer 1 (curing agent 1 utilized) | Ink blocking layer 2 (curing agent 2 utilized) |
| --- | --- | --- |
| 120° C., 20 minutes | Penetration occurred | Penetration did not occur |
| 130° C., 20 minutes | Penetration occurred | Penetration did not occur |
| 140° C., 20 minutes | Penetration occurred | Penetration did not occur |
| 150° C., 20 minutes | Penetration did not occur | Penetration did not occur |
| 160° C., 20 minutes | Penetration did not occur | Penetration did not occur |

As given in Table 4 above, it can be ascertained that, when the curing agent includes an acid, the crosslinking reaction of an epoxy resin can be sufficiently conducted even under a reaction condition of 120° C. and 20 minutes to such a degree that the penetration of uncured resin into the ink blocking layer is prevented or reduced.

Experimental Example 3: Influence Depending on Acid Value of Acid

In order to confirm the influence of the acid value of the acid contained in the curing agent, as given in Table 5 below, an ink blocking layer was prepared in the same manner as in Preparation Example depending on the acid value of an acrylic acid resin, and the results thereof are given in Table 5 below.

TABLE 5

| Acid value | Amount of EDA relative to acid (wt %) | Viscosity of curing agent (poise) | Results |
| --- | --- | --- | --- |
| 0 | 10 | 0 | usable, but crosslinking reaction does not occur |
| 5 | 10 | 50 | usable |
| 10 | 10 | 120 | usable |
| 15 | 10 | 200 | usable |
| 20 | 10 | 500 | usable, but high viscosity |
| 25 | 10 | coagulated | unusable |
| 30 | 10 | coagulated | unusable |
| 40 | 10 | coagulated | unusable |

As given in Table 5 above, when the acid value of the acid is 5 or more, a crosslinking reaction with the epoxy monomer can be sufficiently performed, and when the acid value of acid is 15 or less, a coagulation phenomenon of acid and amine caused by the viscosity of the curing agent becoming too high can be prevented or reduced.

Experimental Example 4: Influence Depending on the Content of Amine

In order to confirm the influence of the content of amine, as given in Table 6 below, an ink blocking layer was prepared in the same manner as in Preparation Example depending on the content of amine, and the results thereof are given in Table 6 below.

TABLE 6

| Acid value | Amount of EDA relative to acid (wt %) | Viscosity of curing agent (poise) | Results |
| --- | --- | --- | --- |
| 15 | 3 | 70 | usable |
| 15 | 5 | 130 | usable |

TABLE 6-continued

| Acid value | Amount of EDA relative to acid (wt %) | Viscosity of curing agent (poise) | Results | |
|---|---|---|---|---|
| 15 | 10 | 200 | usable | |
| 15 | 15 | 350 | usable | |
| 15 | 20 | coagulated | unusable | |

As given in Table 6 above, when the amount of amine relative to acid is less than 20 wt %, the viscosity of the curing agent is prevented from becoming too high by avoiding a coagulation phenomenon of acid and amine.

As described above, according to embodiments of the present disclosure, the epoxy resin contained in the ink blocking layer for a display device has high crosslinking density through a very complicated and dense crosslinking structure, so that the penetration of the uncured adhesive resin can be effectively prevented.

The effects of the present disclosure are not limited by the foregoing, and other various effects are anticipated herein.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims, and equivalents thereof.

What is claimed is:

1. A method of manufacturing an ink blocking layer for a display device, the method comprising:
   preparing a main material comprising an epoxy monomer having three or more epoxy groups and a curing agent comprising an acid and an amine; and
   mixing the main material with the curing agent to prepare an epoxy resin,
   wherein the epoxy monomer has an epoxy equivalent of 95 to 110 g/eq,
   wherein the acid comprises an acrylic acid resin, and
   wherein the epoxy resin comprises an unreacted acrylic acid resin and/or an unreacted amine.

2. The method of claim 1,
   wherein the epoxy monomer is produced by a reaction of a polyhydric alcohol and epichlorohydrin.

3. The method of claim 2,
   wherein the polyhydric alcohol is a trihydric or higher alcohol.

4. The method of claim 3,
   wherein the polyhydric alcohol is a heptahydric or higher alcohol produced by a reaction of a hexahydric or lower alcohol and isocyanate.

5. The method of claim 1,
   wherein the acid comprises a carboxyl group (—COOH).

6. The method of claim 1,
   wherein the acid has an acid value of 5 to 15.

7. The method of claim 1,
   wherein the amine is included in the curing agent in an amount of more than 0 wt % and less than 20 wt % with respect to a total amount of the acid.

8. The method of claim 1,
   wherein the mixing of the main material with the curing agent is performed at 100° C. to 160° C.

9. The method of claim 1,
   wherein the mixing of the main material with the curing agent is performed for 5 to 30 minutes.

10. The method of claim 1,
    wherein the amine comprises at least one selected from the group consisting of triethylenetetramine (TETA), diethylenetriamine (DETA), and ethylenediamine (EDA).

* * * * *